United States Patent
Keshavarzi et al.

(10) Patent No.: US 6,734,498 B2
(45) Date of Patent: *May 11, 2004

(54) INSULATED CHANNEL FIELD EFFECT TRANSISTOR WITH AN ELECTRIC FIELD TERMINAL REGION

(75) Inventors: Ali Keshavarzi, Portland, OR (US); Vivek K. De, Beaverton, OR (US); Siva G. Narendra, Beaverton, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/165,483

(22) Filed: Oct. 2, 1998

(65) Prior Publication Data

US 2002/0011622 A1 Jan. 31, 2002

(51) Int. Cl.⁷ .......................... H01L 27/01; H01L 27/12; H01L 31/0392; H01L 29/76; H01L 29/788
(52) U.S. Cl. ................. 257/347; 257/314; 257/315; 257/350; 257/351
(58) Field of Search ................. 257/347, 314, 257/315, 350, 351, 349

(56) References Cited

U.S. PATENT DOCUMENTS

| 4,907,053 | A | * | 3/1990 | Ohmi ........................ 357/23.1 |
|---|---|---|---|---|
| 5,294,821 | A |   | 3/1994 | Iwamatsu |
| 5,359,219 | A | * | 10/1994 | Hwang ........................ 257/351 |
| 5,461,250 | A |   | 10/1995 | Burghartz et al. |
| 5,621,239 | A |   | 4/1997 | Horie et al. |
| 5,807,772 | A |   | 9/1998 | Takemura |
| 5,889,302 | A |   | 3/1999 | Liu |
| 5,981,345 | A | * | 11/1999 | Ryum et al. ................ 438/303 |
| 6,054,734 | A | * | 4/2000 | Aozasa et al. .............. 257/315 |

OTHER PUBLICATIONS

International PCT Search Report dated Jan. 11, 2000 for application no. PCT/US99/21540 (3 pages).
C. Wann et al., "A Comparative Study of Advanced MOSFET Concepts," IEEE Transactions on Electron Devices, vol. 43, No. 10, Oct. 1996, pp. 1742–1753.

* cited by examiner

*Primary Examiner*—Jerome Jackson
*Assistant Examiner*—Jesse A. Fenty
(74) *Attorney, Agent, or Firm*—Alan K. Aldous

(57) ABSTRACT

In one embodiment, the invention includes a field effect transistor having a substrate, a source, and a drain. An electric field terminal region is lower than the source and drain and is in the substrate. A body is above the electric field terminal region between the source and drain. In another embodiment, the invention includes a field effect transistor having an insulator layer and a body above the insulator layer between a source and a drain. A substrate is below the insulator layer. A gate is above the body and between the source and drain. An electric field terminal region is included in the substrate. The body may be undoped and the threshold voltage be set by setting the distance between the insulator layer and a gate insulator. The body, substrate, and electric field terminal region may float or one or more of them may be biased.

29 Claims, 4 Drawing Sheets

INSULATED CHANNEL FIELD EFFECT TRANSISTOR WITH AN ELECTRIC FIELD TERMINAL REGION

BACKGROUND OF THE INVENTION

1. Technical Field of the Invention

The present invention relates to transistors and more particularly to a field effect transistor have an electric field terminal region.

2. Background Art

Referring to FIG. 1, a prior art bulk metal oxide semiconductor field effect transistors (MOSFET) 10 includes a source (S), drain (D), and gate (G). The gate includes a conductive polysilicon (poly) layer which is separated from a channel by a thin silicon dioxide insulator (gate oxide) layer. MOSFET 10 is an n-channel MOSFET (nMOSFET). Typically, the channel between the source and drain is doped with N type material. The source, drain, and doped channel are formed in a p-well, which in turn is formed in a p-substrate, or are formed directly in the p-substrate.

Referring to FIG. 2, a prior art silicon on insulator (SOI) n-channel MOSFET 20 (SOI transistor 20) includes a source (S), drain (D), and gate (G). The gate includes a poly layer, which is separated from the doped channel by a gate oxide layer. A p-well is separated from a p-substrate by an oxide insulator 22. SOI transistor 20 is referred to as a partially depleted (PD) SOI transistor because oxide insulator 22 is relatively away from the source and drain.

Referring to FIG. 3, a prior art SOI n-channel MOSFET 30 includes a source (S), drain (D), and gate (G) (with a poly layer), a gate oxide layer, and a doped channel. In contrast to SOI transistor 20, an oxide insulator layer 32 is positioned close to the surface of SOI transistor 30. Insulator layer 32 is adjacent (i.e., very close to or are actually touching) the source and drain. SOI transistor 20 is referred to as a fully depleted (FD) SOI transistor because oxide insulator 22 is adjacent to the source and drain and close to the channel. The junction capacitance (Cj) of the source and drain are reduced by positioning insulator oxide layer 22 close to the source and drain, so there is little or no pn junction.

Delta-doped MOSFETs include a doping region under and close to the channel, as shown in C. Wann et al., "A Comparative Study of Advanced MOSFET Concepts," IEEE Transactions on Electron Devices, Vol. 43, No. 10, October 1996, pp. 1742–1753. As shown in C. Wann et al., p. 1743, the doping region is touching the source and drain. The channel can become contaminated with the doping from the doping region.

Each of these transistors suffers from short channel effects (SCE). One cause of SCE in transistors 10, 20, and 30 is that electric field lines between the source and the substrate and between the drain and the substrate are spread throughout much of the channel reducing the effective electrical length (Leff) of the channel. FIG. 3 illustrates an example of an electric field line E between the source and substrate. One cause of SCE in Delta-doped transistors are dopants in the channel. Accordingly, there is a need for a transistor with improved SCE.

SUMMARY

In one embodiment, the invention includes a field effect transistor having a substrate, a source, and a drain. An electric field terminal region is in the substrate. A body is above the electric field terminal region between the source and drain. There is a barrier between the electric field terminal region and the body.

In another embodiment, the invention includes a field effect transistor having an insulator layer and a body above the insulator layer between a source and a drain. A substrate is below the insulator layer. A gate is above the body and between the source and drain. An electric field terminal region is included in the substrate.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

The present invention includes a transistor having an electric field terminal region in a substrate that concentrates electric fields from the source and drain toward the edges of the transistor channel. In the case of an n-channel field effect transistor (NFET) device, the electric field terminal region may be a heavily doped p-type material. In the case of a p-channel field effect transistor (PFET) device, the electric field terminal region may be a heavily doped n-type material. The term "terminal" means an end and could be either end of an electric field line. In some embodiments of the invention, the electric field terminal region is applied as a plane adjacent to a relatively flat insulator layer, and is called a terminal plane or ground plane. The invention may be used with various types of insulated gate field effect devices (referred to as nFET, pFET, or FET devices) of which a MOSFET is merely an example.

Figure 4:
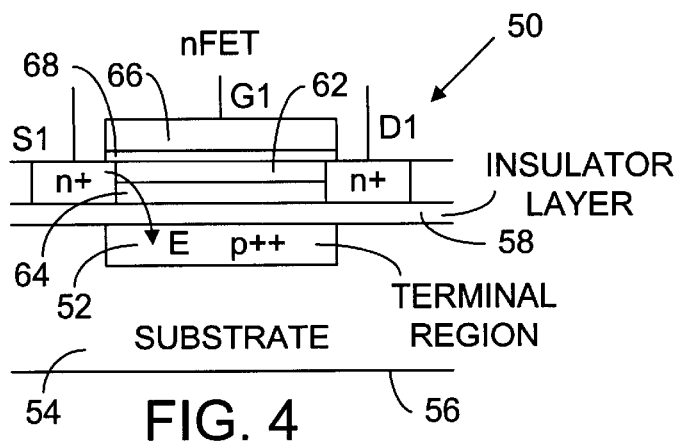
FIG. 4 is a cross-sectional schematic view of an insulated channel field effect transistor with an electric field terminal region according to an embodiment of the invention.

Referring to FIG. 4, an embodiment of the invention includes an nFET 50, which is an insulated channel FET with a p++ electric field terminal region 52 in a substrate 54 (which may be a p-substrate, undoped, or n-doped). NFET 50 is referred to as an insulated channel FET because it includes an insulator layer 58 that insulates a channel 62 from terminal region 52. Insulator layer 58 may be a thin dielectric layer, such as silicon oxide, silicon nitride, a polymer, or a combination of insulators, such as oxynitride or any other insulator. Insulator layer 58 provides a diffusion barrier for the dopants in p++ terminal region 52 in order not to contaminate the channel region. Accordingly, the channel can remain undoped or intrinsic. FET 50 includes a source (S1), drain (D1), and gate (G1) (which includes a conductive material 66, which may be polysilicon), and a gate insulator layer 68 (which may be silicon dioxide (called gate oxide)). Conductive material 66 and gate insulator layer 68 are shown extending slightly over the source/body boundary and drain body boundary, although that is not required. Spacer insulators may be used, but are not illustrated. Insulator layer 58 is adjacent source S1 and drain D1, so as to greatly reduce junction capacitance. (In another embodiment of the invention, the insulator layer in the substrate is not adjacent the source and drain and/or the electric field terminal region is not adjacent the insulator layer in the substrate.)

FET 50 includes a channel 62 and body 64. The terms substrate and body are often used interchangeably. However, in the present disclosure, the term "body" refers to material between insulator layer 58 and a channel 62. The thickness of the body may change as the thickness of the channel changes. The term "substrate" refers to material between insulator layer 58 and the bottom 56 of substrate 54 (sometimes called the backside of the device). Depending on factors including the depths of the source and drain and the voltages applied, channel 62 may be larger or smaller than that illustrated in FIG. 4. Body 64 (and channel 62) may be undoped, slightly doped, or heavily doped. However, an advantage of the present invention is that the body and channel may be updoped. Doping is typically done to control the threshold voltage (Vt). However, in FET 50, the threshold voltage can be controlled by controlling the channel thickness (Tsi). One way to control the channel thickness is through the spacing between insulator layer 58 and gate insulator layer 68. Transistors according to the present invention may be enhancement or depletion mode devices.

Figure 5:
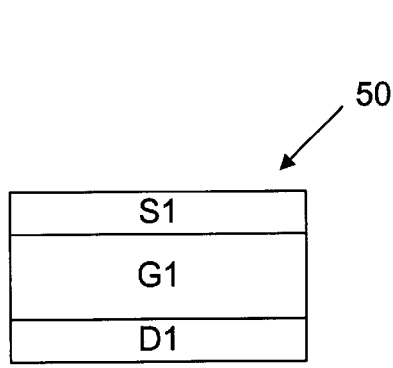
FIG. 5 is a plan view of the transistor of FIG. 4.
Figure 6:
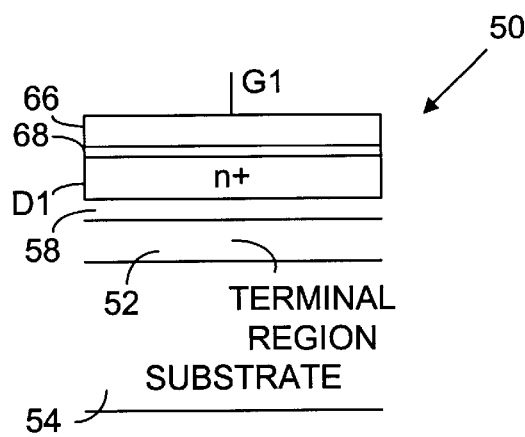
FIG. 6 is a side view of the transistor of FIG. 4.

FIGS. 5 and 6 provide plan and side views of FET 50.

As used herein, the term "above" and similar terms and "below" and similar terms are made with respect an orientation in which gate G1 is above insulator layer 58, and terminal region 52 is below insulator layer 58, regardless of a gravitational orientation. The term "between" means some substantial portion of an object is between two other objects. For example, gate conductive material 66 and terminal region 52 are both between source S1 and drain D1.

The combination of an undoped body, insulator layer 58, and terminal region 52 may give FET 50 close to an ideal super steep well/channel doping profile as compared to a regular bulk MOSFET, which improves SCE. The ideal channel doping profile is not achievable in a typical FET device structure because dopant diffusion from the substrate to the channel. Terminal region 52 is positioned below the channel and gate area. Terminal region does not extend far underneath the source and drain junctions to minimize junction capacitance (Cj). However, in the illustrated embodiment of FIG. 4, terminal region 52 extends under source S1 and drain D1 just enough to terminate the electric field lines from source S1 and drain D1. Terminal region 52 can be extended more under the source and drain if junction capacitance is not a major concern. Insulator layer 58 eliminates or greatly reduces junction leakage between the source and substrate and between the drain and substrate.

It is believed that terminal region 52 improves short channel effects (SCE) of FET 50 for the following reasons. Terminal region 52 helps improve SCE by allowing a higher aspect ratio. Aspect ratio is the ratio of the lateral device dimension (effective channel length) to vertical dimension (a combination of oxide thickness, junction depth, and channel depletion width with equal weight). More particularly, the aspect ratio of a FET is defined in equation (1) below:

$$\text{Aspect Ratio} = L_{\text{eff}} / D_{\text{eff}} \quad (1)$$

$$= L_{\text{eff}} / (T_{ox} \, D \, X_j)^{1/3},$$

where Leff is an effective channel length between source and drain, Tox is the thickness of the gate oxide between the gate and silicon, D is the depth of the channel depletion region, and Xj is the junction depth of the source and drain. SCE refers to a situation in which the gate does not have good control over the channel region. SCE, if present, is decreased (and the gate has more control over the channel) when the aspect ratio is increased.

Figure 1:
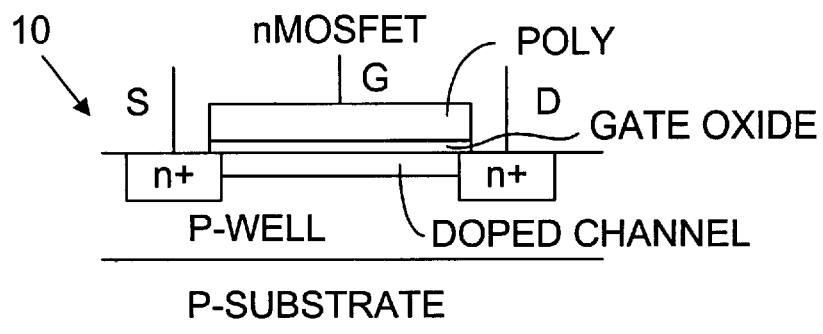
FIG. 1 is a cross-sectional schematic view of a prior art bulk MOSFET transistor.
Figure 2:
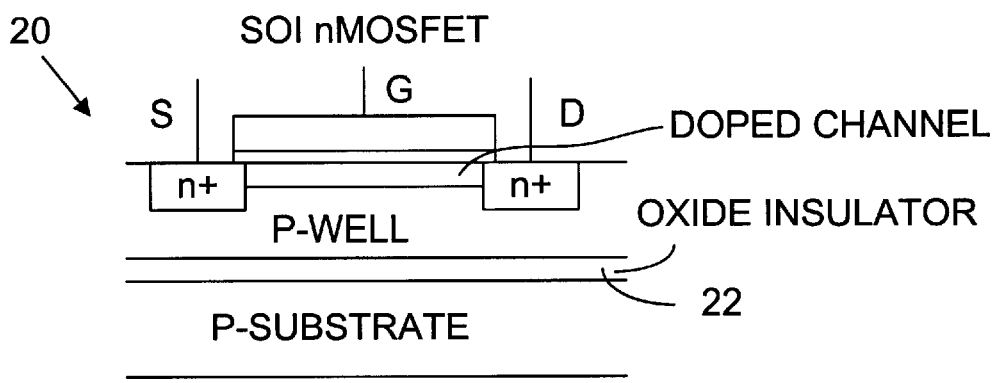
FIG. 2 is a cross-sectional schematic view of a prior art SOI transistor.
Figure 3:
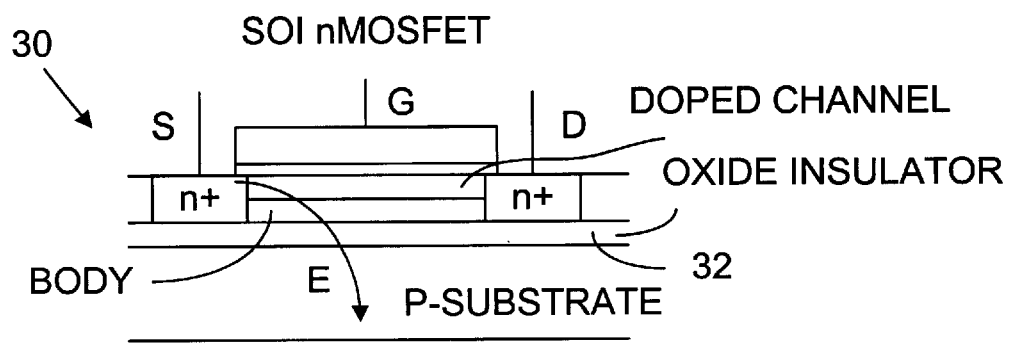
FIG. 3 is a cross-sectional schematic view of a prior art SOI transistor.
Figure 7:
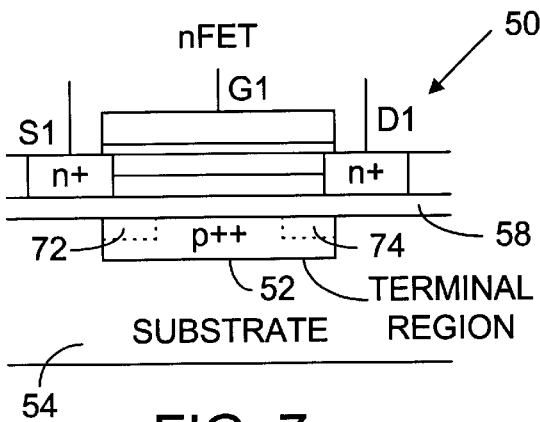
FIG. 7 is a side view of the transistor of FIG. 4 illustrating sections of the electric field terminal region at which terminal ends of fields may be concentrated.

Terminal region 52 helps increase Leff by concentrating the electric field lines to near the source and drain, away from much of the channel. In MOSFET 50, electric field lines between the n+source S1 and substrate 54 are directed toward a section of p++ terminal region 52 near source S1. In FIG. 4, an electric field line E is shown much nearer the source/body boundary than in prior art FIG. 3. Likewise, electric field lines between the n+ drain D1 and substrate 54 are directed toward a section of p++ terminal region 52 near drain D1. Referring to FIG. 7, section 72 is an example of a section that most of the electric field lines from source S1 would hit. Section 74 is an example of a section that most of the electric field lines from the drain (D1) would hit. Sections 72 and 74 are shown in dashed lines because they do not necessarily include a different material than the remainder of terminal region 52. The precise locations of sections 72 and 74 depend on various factors including the depth of the source and drain, width between the source and drain, and the doping level of terminal region 52. In effect, terminal region 52 concentrates the electrical field lines in sections of terminal region 52 near the source and drain, dramatically reducing the amount of electrical field lines that cover channel 62. This results in a greater Leff than would be occur without terminal region 52. Note that it is possible that some of the electric field lines may be through terminal region 52.

Figure 8:
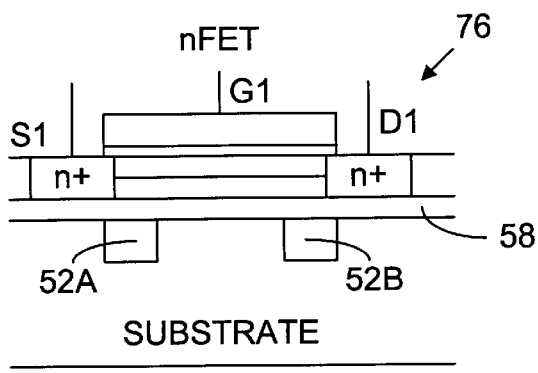
FIG. 8 is a cross-sectional schematic view of an insulated channel field effect transistor with electric field terminal regions according to an embodiment of the invention.

Referring to FIG. 8, in an alternative embodiment, nFET 76 includes two terminal regions 52A and 52B instead of the single terminal region 52.

Terminal region 52 also helps improve aspect ratio by decreasing Deff by repelling the depletion region. NFET 76 may be less effective than nFET 50 in decreasing Deff.

An undoped channel improves Vt roll-off, which improves SCE. Terminal region 52 may also assist in improved Vt roll-off. Drain induced barrier lowering (DIBL) is also improved, which also improves SCE.

With improved SCE, the transistors of the present invention can be more scaleable in, for example, Vt, power supply voltage (Vdd), and/or dimensions.

The following describes one method by which nFET 50 may be fabricated. First, insulator layer 58 is implanted into the substrate. (Before insulator layer 58 is implanted, nFET 50 has not been divided between substrate and body.) Next, terminal region 52 is implanted into the substrate next to insulator layer 58. Next, the source and drain regions are created. Insulator layer 58 could be implanted after terminal region 52 is implanted, but if that is done, doping form terminal region 52 may diffuse into the body area before insulator layer 58 is implanted. Other methods of fabricating FETs according to the present invention may be used. If an insulator layer is not used, the body is above the electric field terminal region and the substrate is below the electric field terminal region. Where there is no insulator layer, depending on various factors, there still may be a barrier where the electric field terminal region is significantly away from the source and drain and channel by being significantly lower than the source and drain with respect to the gate (i.e., the electric field terminal region may be positioned significantly lower than an imaginary line extending between the bottom of the source and the bottom of the drain).

As noted, in FIG. 4, a portion of terminal region 52 extends slightly below the source and drain. The terminal regions could extend to a greater extent (including completely) beneath the source and drain. However, doing so would tend to increase the junction capacitance (Cj) of the source and drain. Accordingly, in situations in which it is desirable to keep the junction capacitance low, the fabrication process may involve the terminal region not extending much beneath the source and drain. For example, in FIG. 9, in nFET 78, terminal region 52 extends to only directly below the source/body and drain/body boundaries. If given a choice, it may be better to have the terminal region boundary extend slightly below the source or drain, than have it not extend to beneath the source/body boundary or drain/body boundary. Because there may be unintentional variations in the application of the terminal region., it may be better to have a target that is slightly beneath the source or drain (as in FIG. 4) rather than having a target that is exactly below the source/body and drain/body boundaries. That way terminal region 52 will still extend to beneath the source/body and drain/body boundaries, even if the boundary of terminal region 52 is slightly shorter than the target points. In other words, a perfectly self-aligning process is not necessary.

Figure 9:
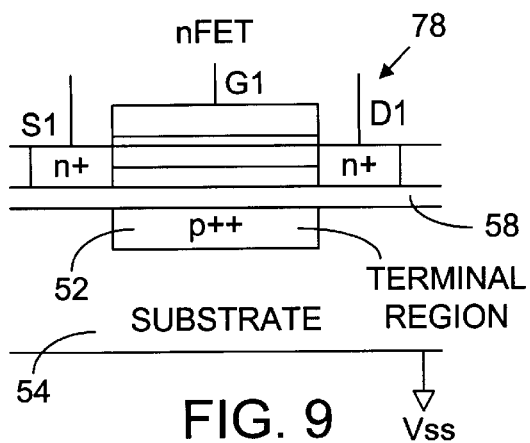
FIG. 9 is a cross-sectional schematic view of an insulated channel field effect transistor with a terminal region according to an embodiment of the invention.

The potentials of body 64, terminal region 52, and substrate 54 may float. Alternatively, one or more of body 64, terminal region 52, and substrate 54 may be biased to a specific potential. For example, in FIG. 4, substrate 54 may float. In FIG. 9, substrate 54 is biased to Vss (or Vgnd). In the case of a pFET, substrate 54 may be biased to Vdd. In FIG. 9, the bias is illustrated as being applied to backside 56, but could be applied through a tap or other contact similar to that illustrated in FIGS. 10–14.

Figure 10:
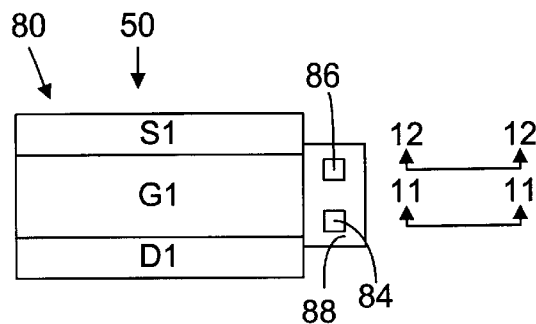
FIG. 10 is plane view of a transistor according to an embodiment of the invention.
Figure 11:
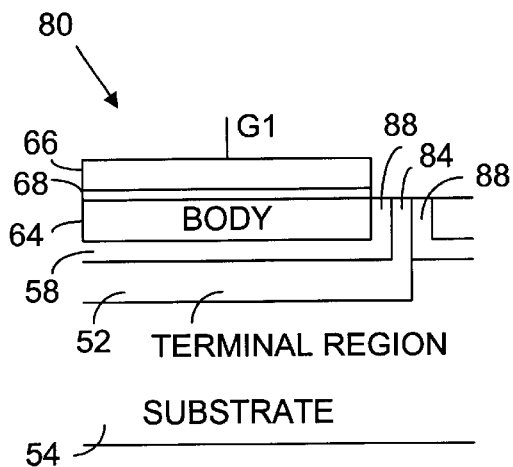
FIG. 11 is a cross-sectional schematic side view of the transistor of FIG. 10 taken at lines 11—11.
Figure 12:
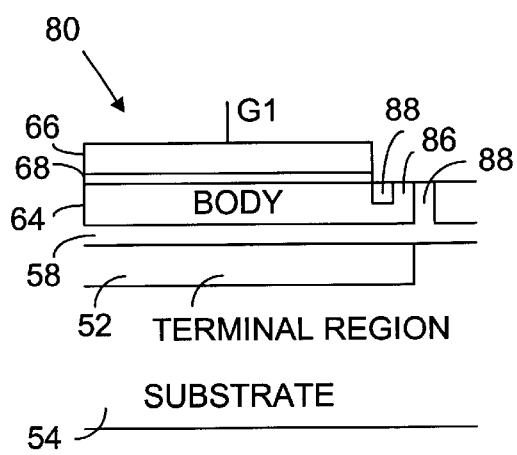
FIG. 12 is a cross-sectional schematic side view of the transistor of FIG. 10 taken at lines 12—12.
Figure 13:
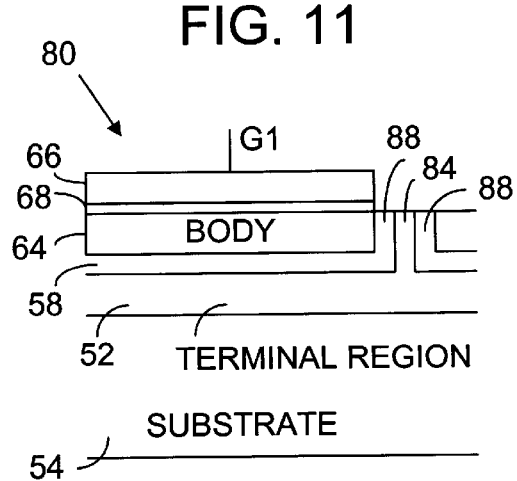
FIG. 13 is a cross-sectional schematic side view of the transistor of FIG. 10 taken at lines 11—11.
Figure 14:
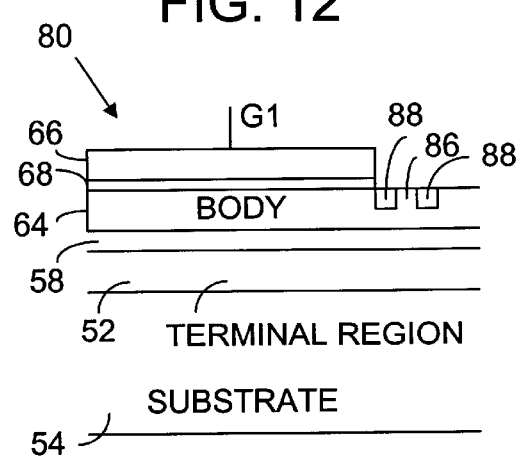
FIG. 14 is a cross-sectional schematic side view of the transistor of FIG. 10 taken at lines 12—12.

Referring to FIG. 10, a die 80 includes nFET 50, taps 84 and 86, and insulator material 88. In FIG. 4, the potential of terminal region 52 and body 64 float. In FIG. 10, terminal region 52 and body 64 are coupled to taps 84 and 86, respectively, and are biased to the potential provided by the taps. In an nFET, the terminal region might be at ground. In a pFET, the terminal region might be at Vdd. The bias applied to the body may make the FET forward biased, reverse biased, or zero biased. FIGS. 11 and 12 show cross sections nFET 50 taken along lines 11—11 and 12—12, respectively. Alternatively, only terminal region 52 or only body 64 might be coupled to the tap. In the embodiment of FIG. 10, substrate 54 may float or be biased. FIGS. 13 and 14 are similar to FIGS. 11 and 12, except that terminal region 52 and body 64 are shared by more than one transistor (such as transistors T1 and T3 in FIG. 16).

Figure 15:
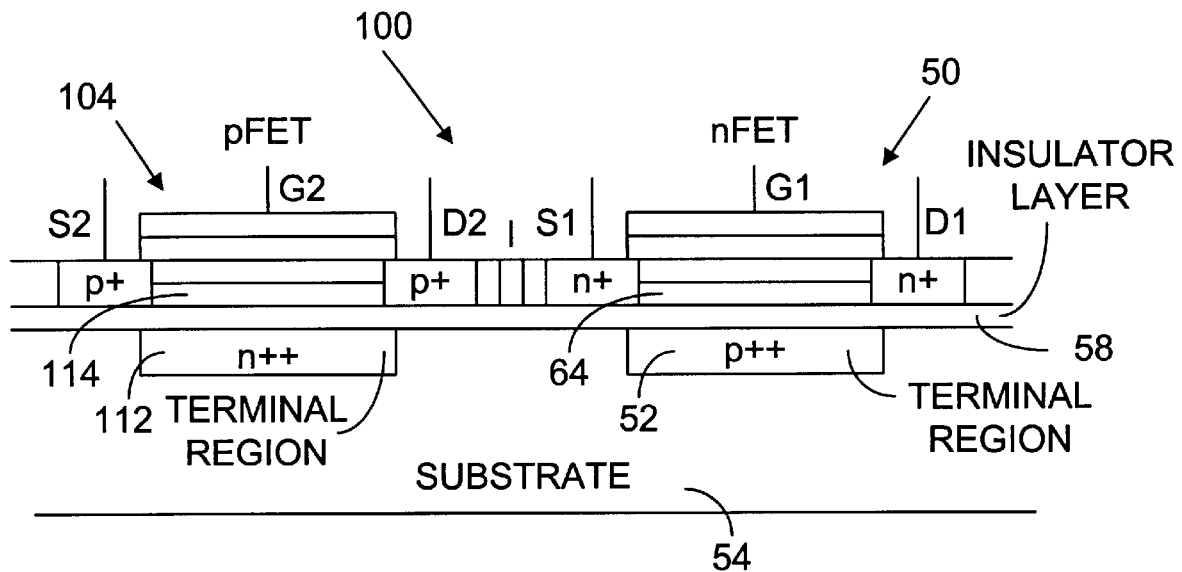
FIG. 15 is a cross-sectional schematic view of two insulated channel field effect transistors with electric field terminal regions according to an embodiment of the invention.

A transistor according to the present invention may be a pFET. Referring to FIG. 15, a chip 100 includes NFET device 50 and a pFET device 104. Insulator layer 58 extends beneath transistors 50 and 104 (alternatively, there could be separate insulating layers). An n++ electric field terminal region 112 is formed in substrate 54 (but could be formed in a well). Terminal region 112 and a body 114 may float or be biased. If terminal region 112 is formed in a well, the well may be biased or float. PFET 104 may include two terminal regions (similar to that shown in FIG. 8), rather than merely one (terminal region 112) as shown in FIG. 15.

Figure 16:
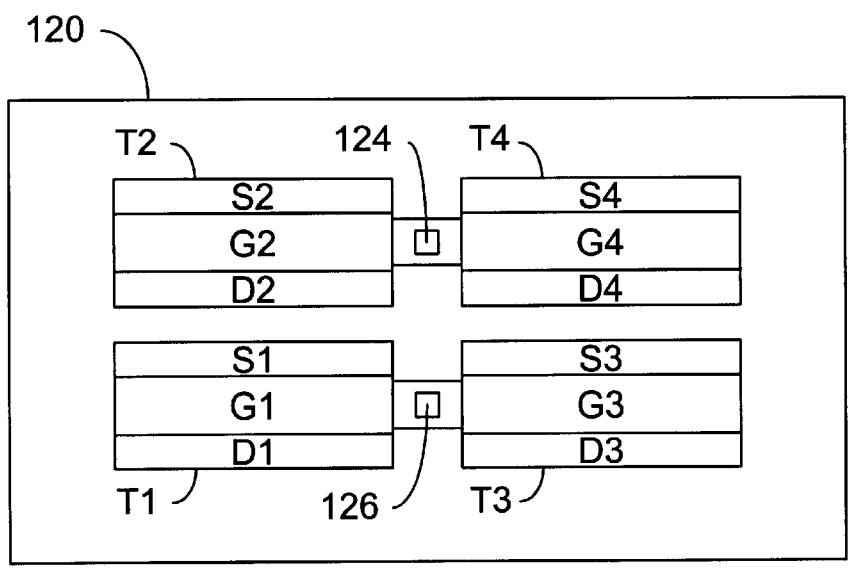
FIG. 16 is a plan view of transistors according to an embodiment of the invention.

FIG. 16 illustrates a die 120 that includes transistors T1, T2, T3, and T4, as well as a variety of other transistors and components not shown. Transistors T1 and T3 may share a body and/or a terminal region. Transistor T1 and T3 could share a terminal region, but junction capacitance may increase to an intolerable level. Transistors T2 and T4 may share a body and/or a terminal region. Taps 124 and 126 may be used to bias a substrate, body, or terminal region. More than one tap may be used (as shown in FIG. 10).

Additional Information and Embodiments

The various figures are schematic in nature. For example, the sizes of the various components are not to relative scale or intended to precisely illustrate actual shapes.

Merely as examples, the following dimensions may be used, although the components may have various other smaller or larger dimensions. Terminal region 52 may have a p++ doping that is greater than $10^{-20}$ cm$^{-3}$. Insulator layer 58 may be thinner that gate insulator layer 64. The back oxide effective thickness (Thor) may be about 2 to 2.5 nanometers (nm). An undoped intrinsic channel region may have a channel thickness (Tsi) of about 20 nm. As presently understood, the insulated channel MOSFET has close to the ideal subthreshold swing slope of about 60 mV per decade at room temperature. (That understanding may change with further research.) This is mainly due to its undoped and fully depleted channel. However, these numbers are merely examples, and transistors according to the present invention may have these parameters with greater or lesser values.

The source and drain may be very heavily doped or have a lesser doping level (such as is commonly used). A thin gate oxide layer may be used to have good drive and minimal SCE. Whether a p or n-type substrate is used, the devices can be formed in p and/or n wells.

As mentioned, the threshold voltage may be set by the thickness of the channel (Tsi) rather than by channel doping or a combination of the thickness and channel doping. External resistance (Rext) and series resistance may increase if the source and drain junctions become more shallow due to insulating layer 58 being set closer to gate insulator 68 (yielding a smaller Tsi). A mobility enhancement technique such as SiGe source/drain and/or raised source/drain structures or other techniques may be used to lower the series resistance.

Insulator layer 58 may help with soft error immunity.

Keeping insulator layer 58 very thin may help with self-heating.

A fully depleted SOI MOSFET is costly. The present transistor structure does not need a SOI wafer supply and SOI type processing.

If the specification states a component, feature, structure, or characteristic "may", "might", or "could" be included, that particular component, feature, structure, or characteristic is not required to be included. Reference in the specification to "an embodiment" or "one embodiment" means that a particular feature, structure, or characteristic described in connection with the embodiment is included in at least some embodiments, but not necessarily all embodiments, of the invention. The various appearances "an embodiment" or "one embodiment" are not necessarily all referring to the same embodiments.

Those skilled in the art having the benefit of this disclosure will appreciate that many other variations from the foregoing description and drawings may be made within the scope of the present invention. Accordingly, it is the following claims including any amendments thereto that define the scope of the invention.

What is claim is:

1. A field effect transistor, comprising:
   an insulator layer;
   a body above the insulator layer between a source and a drain;
   a substrate below the insulator layer;
   a gate above the body and at least a substantial portion of the gate is above an area between the source and drain; and
   an electric field terminal region in the substrate to concentrate electric fields from the source and drain toward edges of a channel of the transistor, the electrical field terminal region extending beneath the entire length of the channel and slightly beneath the source and drain such that almost all the region beneath the source and drain is free of the terminal region.

2. The transistor of claim 1, wherein the body is undoped.

3. The transistor of claim 1, wherein the body is lightly doped.

4. The transistor of claim 1, wherein the channel is formed in the body between the source and drain when certain voltages are applied to the source, gate, and drain, and the channel is undoped.

5. The transistor of claim 1, wherein a threshold voltage is set by a distance between the insulator layer and a gate insulator.

6. The transistor of claim 1, wherein the body floats.

7. The transistor of claim 1, wherein the body is biased.

8. The transistor of claim 1, wherein the electric field terminal region floats.

9. The transistor of claim 1, wherein the electric field terminal region is biased.

10. The transistor of claim 1, wherein the substrate floats.

11. The transistor of claim 1, wherein the substrate is biased.

12. The transistor of claim 1, wherein the transistor is a pMOSFET.

13. The transistor of claim 1, wherein the transistor is an nMOSFET.

14. A field effect transistor, comprising:
    a substrate;
    a source, a drain, and a gate;
    a first electric field terminal region in the substrate, the first electrical field terminal region extending beneath a small portion of the source and beneath a first portion of the gate that is between the source and drain;
    a second electric field terminal region in the substrate, the second electrical field terminal region extending beneath a small portion of the drain and beneath a second portion of the gate that is between the source and drain;
    a body above the electric field terminal region between the source and drain, wherein there is a barrier between the electric field terminal region and the body.

15. The transistor of claim 14, wherein the body is undoped.

16. The transistor of claim 14, wherein the body is lightly doped.

17. The transistor of claim 14, wherein a channel is formed in the body between the source and drain when certain voltages are applied to the source, gate, and drain, and the channel is undoped.

18. The transistor of claim 14, wherein a threshold voltage is set by a distance between the insulator layer and a gate insulator.

19. The transistor of claim 14, wherein the body floats.

20. The transistor of claim 14, wherein the body is biased.

21. The transistor of claim 14, wherein the electric field terminal region floats.

22. The transistor of claim 14, wherein the electric field terminal region is biased.

23. The transistor of claim 14, wherein the substrate floats.

24. The transistor of claim 14, wherein the substrate is biased.

25. A field effect transistor, comprising:
    an insulator layer;
    a body above the insulator layer between the source and a drain;
    a substrate below the insulator layer;
    a gate above the body and at least a substantial portion of the gate is above an area between the source and drain; and
    an electric field terminal region in the substrate to concentrate electric fields from the source and drain toward edges of a channel of the transistor, the electrical field terminal region extending from slightly beneath the source to slightly beneath the drain including beneath the channel, but not otherwise beneath the source and drain.

26. The transistor of claim 25, wherein the body floats.

27. The transistor of claim 25, wherein the body is biased.

28. The transistor of claim 25, wherein the electric field terminal region floats.

29. The transistor of claim 25, wherein the electric field terminal region is biased.

* * * * *